(12) United States Patent
Azumi et al.

(10) Patent No.: US 6,976,852 B2
(45) Date of Patent: Dec. 20, 2005

(54) SOCKET FOR ELECTRICAL PARTS

(75) Inventors: Leo Azumi, Saitama (JP); Tsuyoshi Watanabe, Saitama (JP)

(73) Assignee: Enplas Corporation, Saitama (JP)

( * ) Notice: Subject to any disclaimer, the term of this patent is extended or adjusted under 35 U.S.C. 154(b) by 0 days.

(21) Appl. No.: 10/889,070

(22) Filed: Jul. 13, 2004

(65) Prior Publication Data

US 2005/0014399 A1    Jan. 20, 2005

(30) Foreign Application Priority Data

Jul. 15, 2003   (JP)  .............................. 2003-197355

(51) Int. Cl.[7] ............................................. H01R 12/00

(52) U.S. Cl. ......................................................... 439/73

(58) Field of Search .......................... 439/73, 157, 159, 439/863, 864, 372, 160; 361/685

(56) References Cited

U.S. PATENT DOCUMENTS

| | | | | |
|---|---|---|---|---|
| 5,295,841 A | * | 3/1994 | Grabbe et al. | 439/73 |
| 5,961,344 A | * | 10/1999 | Rosales et al. | 439/495 |
| 6,045,377 A | * | 4/2000 | Kajiura | 439/159 |
| 6,912,124 B2 | * | 6/2005 | Megason et al. | 361/685 |

FOREIGN PATENT DOCUMENTS

JP     HEI 7-42063      7/1995

* cited by examiner

*Primary Examiner*—Chandrika Prasad
(74) *Attorney, Agent, or Firm*—Staas & Halsey LLP

(57) ABSTRACT

A socket for electrical parts includes driving mechanisms that move pressing members from a depressed position to a retired position when an operating member is vertically shifted. The operating member includes racks each of which has rack gears in the vertical direction. Follower gears engageable with the rack gears are also provided. The follower gears have different distances from the rotational pivot to the pitch circle. When the operating member is depressed, the follower gear with a longer distance from the rotational pivot to the pitch circle is engaged with one of the rack gears.

17 Claims, 14 Drawing Sheets

SOCKET FOR ELECTRICAL PARTS

BACKGROUND OF THE INVENTION

1. Field of the Invention

The present invention relates to a socket for electrical parts that is used for performance tests on electrical parts such as IC packages.

2. Related Art

An example of sockets for electrical parts of a known type is described in Japanese Unexamined Utility Model Application Publication No. 7-42063A. According to the description, a semiconductor device is placed on a semiconductor-device-holding plate, and handling member is depressed. In accordance with this downward movement of the handling member, the semiconductor-device-holding plate is shifted outside of the side wall of the socket and thus detached from the semiconductor device. On the other hand, in accordance with the downward movement of the handling member, a pressing member depresses the peripheral portion of the semiconductor device and thus the semiconductor device is fitted on the bottom wall of the socket.

According to such a socket for electrical part, in accordance with the downward movement of the handling member, the pressing member is rotationally moved through a rack and a pinion to press the semiconductor device and thus the stroke of the handling member is long. Moreover, the pressing member is rotationally moved at a predetermined speed. Therefore, as the rotation speed of the rack and pinion increases, the test time can be shortened but the chance of giving a shock to the electrical part might increase at the time of pressing. On the other hand, as the rotation speed of the rack and pinion decreases, the chance of giving a shock to the electrical part is diminished but the test time is prolonged.

Due to the limited rotational movement of the rack and pinion, the pressing portion of the pressing member moves in an arc. Therefore, the pressing portion depresses the electrical part obliquely, not perpendicularly, and may thus scratch the upper surface of the electrical part.

SUMMARY OF THE INVENTION

An object of the present invention is to substantially eliminate defects or drawbacks encountered in the related art mentioned above and to provide a socket for electrical parts capable of reducing the stroke of a handling member (operation member) with minimum operating force and shortening the time of the performance test while suppressing the shock to the electrical parts.

Another object of the present invention is to provide a socket for electrical parts capable of flexibly determining the path of the pressing member and thus effectively making the pressing member press the electrical part and retire from its pressing position.

According to a first aspect of the present invention, a socket for electrical parts includes: a socket body for accommodating an electrical part; a pressing member for pressing the electrical part accommodated in the socket body; an operating member disposed to the socket body so as to move vertically; and a driving mechanism for shifting the pressing member from a pressing position to a retired position in accordance with vertical movement of the operating member. In the socket, the driving mechanism includes a rack disposed to the operating member in the vertical direction, the rack including a rack gear, and a follower gear engageable with the rack gear, the follower gear having a first portion and a second portion, the distance from a rotational pivot to a pitch circle of the follower gear being longer at the first portion than at the second portion. Furthermore, when the operating member is depressed, the first portion of the follower gear is engaged with the rack gear. Thus, when the electrical part is pressed, the leverage is increased so that the pressing force to the electrical part is increased. When the electrical part is not pressed, the leverage remains small. Furthermore, shock is suppressed in the electrical part, and the operating member has a small stroke. Also, a test time can be shortened.

According to another aspect of the present invention, in the socket for electrical parts, preferably, the driving mechanism includes cam, the cam including the follower gear so as to rotate the cam around the rotational pivot, and the pressing member is movable between the pressing position and the retired position in accordance with rotational movement of the cam. Therefore, since the force from the operating member is applied to the pressing member through the gear mechanism and the cam mechanism, the operating member and the pressing member can be operatively well associated.

According to yet another aspect of the present invention, in the socket for electrical parts, preferably, the cam includes a cam groove, the pressing member includes a driving portion, and the socket body includes guide portion, the driving portion being disposed in the cam groove, the driving portion being guided by each guide portion. Furthermore, preferably, when the cam is rotated, the driving portion is shifted to the intersection of the cam groove of the cam and the guide portion of the socket body so that the pressing member is moved from the pressing position to the retired position. Accordingly, the shift path and shift speed of the pressing member can be optionally determined with relatively ease and electrical parts can be pressed and the pressing member can be retired effectively.

According to still another aspect of the present invention, in the socket for electrical parts, preferably the pressing member is disposed rotationally movable to the socket body.

According to another aspect of the present invention, in the socket for electrical parts, preferably the rack includes a plurality of rack gears on both sides thereof. Therefore, the two cams share a single rack, whereby the socket of the present invention has a simple structure.

According to another aspect of the present invention, a socket for electrical parts includes: a socket body for accommodating an electrical part, a pressing member for pressing the electrical part accommodated in the socket body; an operating member disposed to the socket body so as to move vertically; and a driving mechanism for shifting the pressing member from a pressing position to a retired position in accordance with vertical movement of the operating member, the driving mechanism having cam that rotate in accordance with the vertical movement of the operating member, the cam including a cam groove in which a driving portion of the pressing member is disposed. In the socket, when the cam is rotated, the driving portion is shifted to the intersection of the cam groove of the cam and the guide portion of the socket body so that the pressing member is moved from the pressing position to the retired position. Accordingly, the shift path of the pressing member can be optionally determined with relatively ease and electrical parts can be pressed and the pressing member can be retired effectively.

According to another aspect of the present invention, in the socket for electrical parts, preferably the guide portion includes a depressed-side guide portion for guiding the driving portion in a substantially vertical direction when the pressing member is in the vicinity of a pressing position. Accordingly, the pressing member presses the electrical part substantially vertically and is retired from the electrical part substantially vertically. Accordingly, the pressing member presses the electrical part and retires from the pressing position without scratching the top surface of the electrical part.

According to another aspect of the present invention, in the socket for electrical parts, preferably, the cams and the guide portions are disposed on both sides of the square electrical part, the length of the pressing members is longer than that of the electrical part, and the pressing members press the electrical part across the entire length thereof. Thus, the occurrence of warping in the electric part can be suppressed.

According to another aspect of the present invention, in the socket for electrical parts, preferably, the pressing member has a rod-like shape, and the driving portion protrudes from both ends of the pressing member. Therefore, the pressing member has a simple structure.

According to another aspect of the present invention, in the socket for electrical parts, preferably the pressing member includes a base end portion and a pressing portion, the base end portion having a base-end-side ellipsoidal opening in cross section, and the socket body includes a shaft which is inserted loosely into the base-end-side ellipsoidal opening in cross section with a clearance therein. Preferably, the pressing portion includes a pressing-side ellipsoidal opening in cross section and the driving portion is movably disposed in the pressing-side ellipsoidal opening. Accordingly, the pressing member can press the electrical part across the upper surface thereof.

According to another aspect of the present invention, in the socket for electrical parts, preferably, the driving mechanism includes a rack disposed to the operating member in the vertical direction, the rack including a rack gear, and the cam includes a cam-side gear engageable with the rack gear. Therefore, since the force from the operating member is applied to the pressing member through the gear mechanism and the cam mechanism, the operating member and the pressing member can be operatively well associated.

According to another aspect of the present invention, in the socket for electrical parts, preferably a pair of the cams are disposed on both sides of each rack. Therefore, the two cams share a single rack, and are rotated by the single rack whereby the socket of the present invention has a simple structure.

According to another aspect of the present invention, in the socket for electrical parts, preferably, the pressing member includes a heat sink. Therefore, heat can be effectively dissipated in the electrical part.

According to another aspect of the present invention, in the socket for electrical parts, preferably an urging member that urges the operating member upward is disposed, and urging force of the urging member acts on the cam so that the driving portion is depressed. Therefore, additional springs are not needed in the transmission path of driving force from the operating member to the pressing member so that the socket of the present invention has a simple construction.

According to another aspect of the present invention, in the socket for electrical parts, preferably, a plurality of urging members are aligned on each opposing side of the operating member that has a square shape when viewed from the top. Therefore, the urging member with a small urging force can be disposed in the socket at an appropriate position.

BRIEF DESCRIPTION OF THE DRAWINGS

FIG. 5 is a perspective view of the IC socket, showing racks of the operating member, cam, pressing member and the like;

DESCRIPTION OF THE PREFERRED EMBODIMENTS

Embodiments of the present invention will now be described by referring to the accompanying drawings.

[First Embodiment]

Referring to FIGS. 1 to 10, a first embodiment of the present invention will now be described. In a performance test of an IC package 12 as an "electrical part", the IC package 12 is accommodated in an IC socket 11 as a "socket for electrical parts" and is thus electrically connected thereto.

Figure 6:
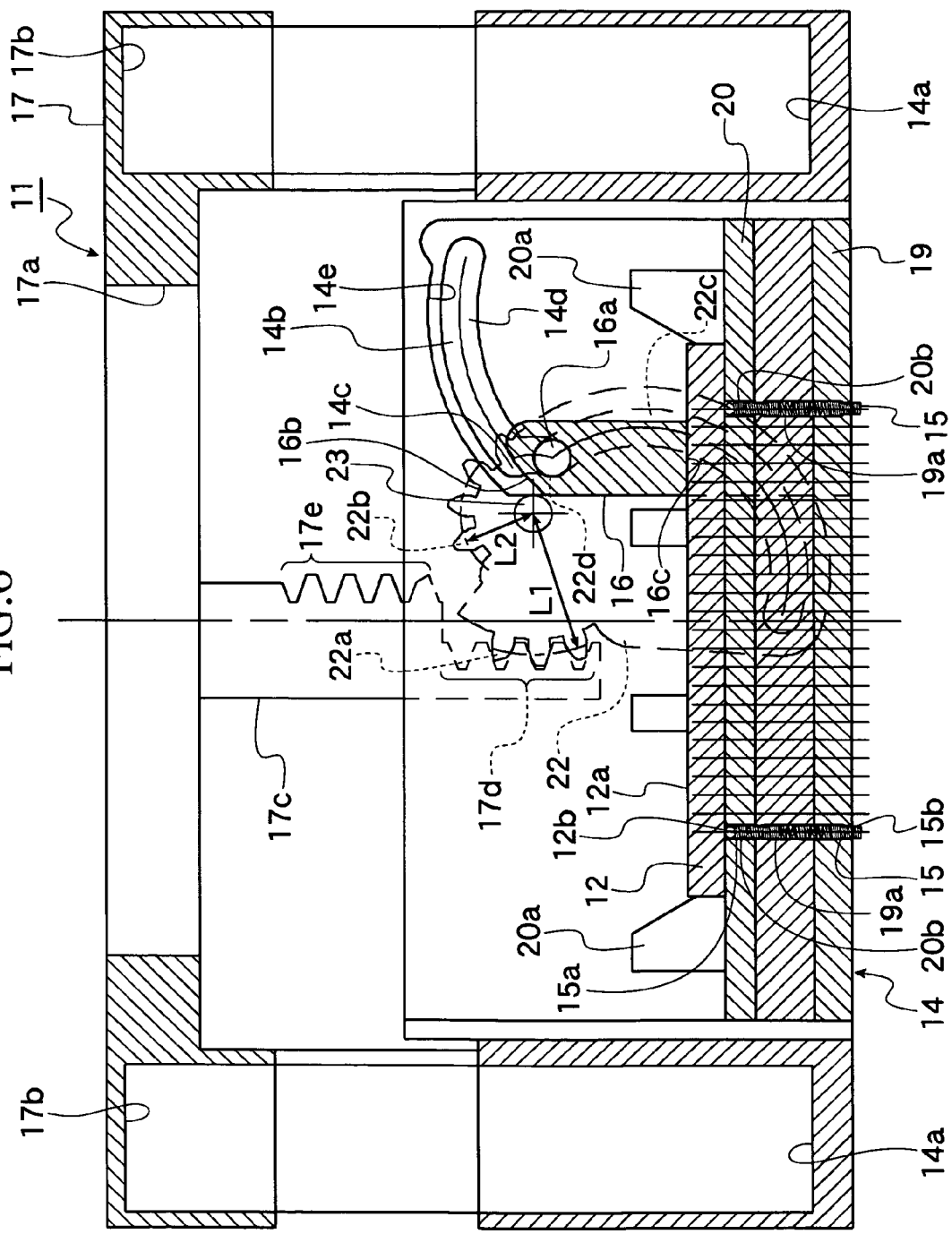
FIG. 6 is a cross-sectional view of the IC socket according to the first embodiment when the operating member is at the highest position.

Referring to FIG. 6, a plurality of solder balls 12b as terminals is disposed at a narrower pitch over the bottom surface of a square package body 12a and is electrically connected to the IC socket 11.

The IC socket 11 includes a socket body 14, contact pins 15, pressing member 16, an operating member 17, and driving mechanisms. The socket body 14 accommodates the IC package 12. The contact pins 15 are provided in the socket body 14. The pressing members 16 press the IC package 12 accommodated in the socket body 14. The operating member 17 is disposed vertically movable to the socket body 14. The driving mechanisms move the pressing members 16 from a pressing position to a retired position when the operating member 17 is moved vertically.

Figure 7:
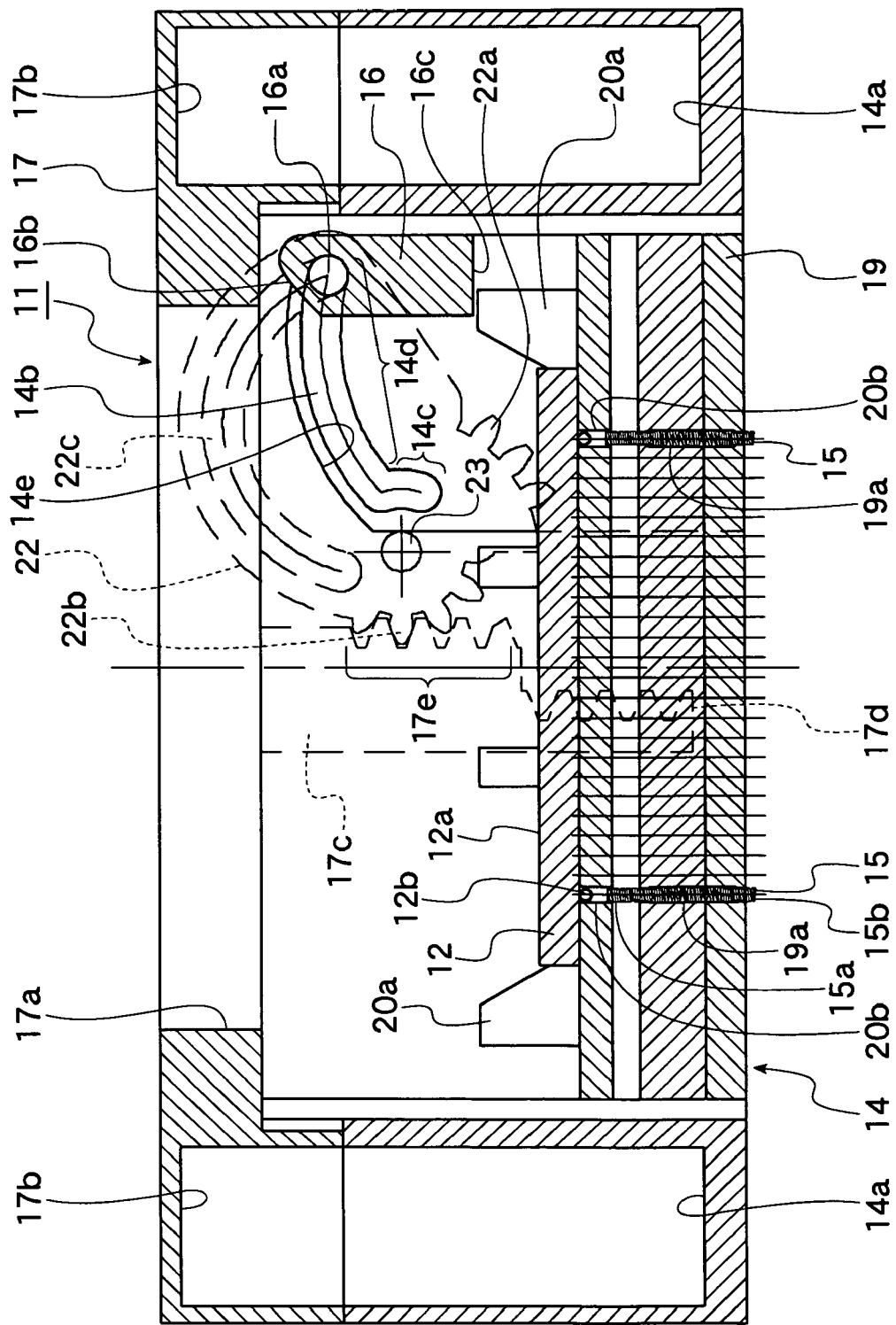
FIG. 7 is a cross-sectional view of the IC socket according to the first embodiment when the operating member is at the lowest position.

More specifically, the socket body 14 includes a base 19 and a floating plate 20. The floating plate 20 disposed above the base 19 is urged upward by springs 21 (shown in FIG. 2) so as to move vertically. As shown in FIGS. 6 and 7, the floating plate 20 accommodates the IC package 12 on the upper surface thereof and includes guides 20a. At the time when the IC package 12 is accommodated, the guides 20a guide the peripheries of the IC package 12. And base 19 and floating plate 20 are formed with through holes 19a and 20b in which a plurality of contact pins 15 are disposed.

As shown in FIGS. 6 and 7, the solder balls 12b provided at the IC package 12 are inserted in the top portion of the through holes 20b. The contact pins 15 are disposed in the through holes 19a and 20b, whereby top ends 15a of the contact pins 15 are in contact with the solder balls 12b of the IC package 12, while bottom ends 15b of the contact pins 15 are in contact with an electrode in a wiring substrate (not shown) at a predetermined contact pressure and thus electrically connected thereto.

Figure 2:
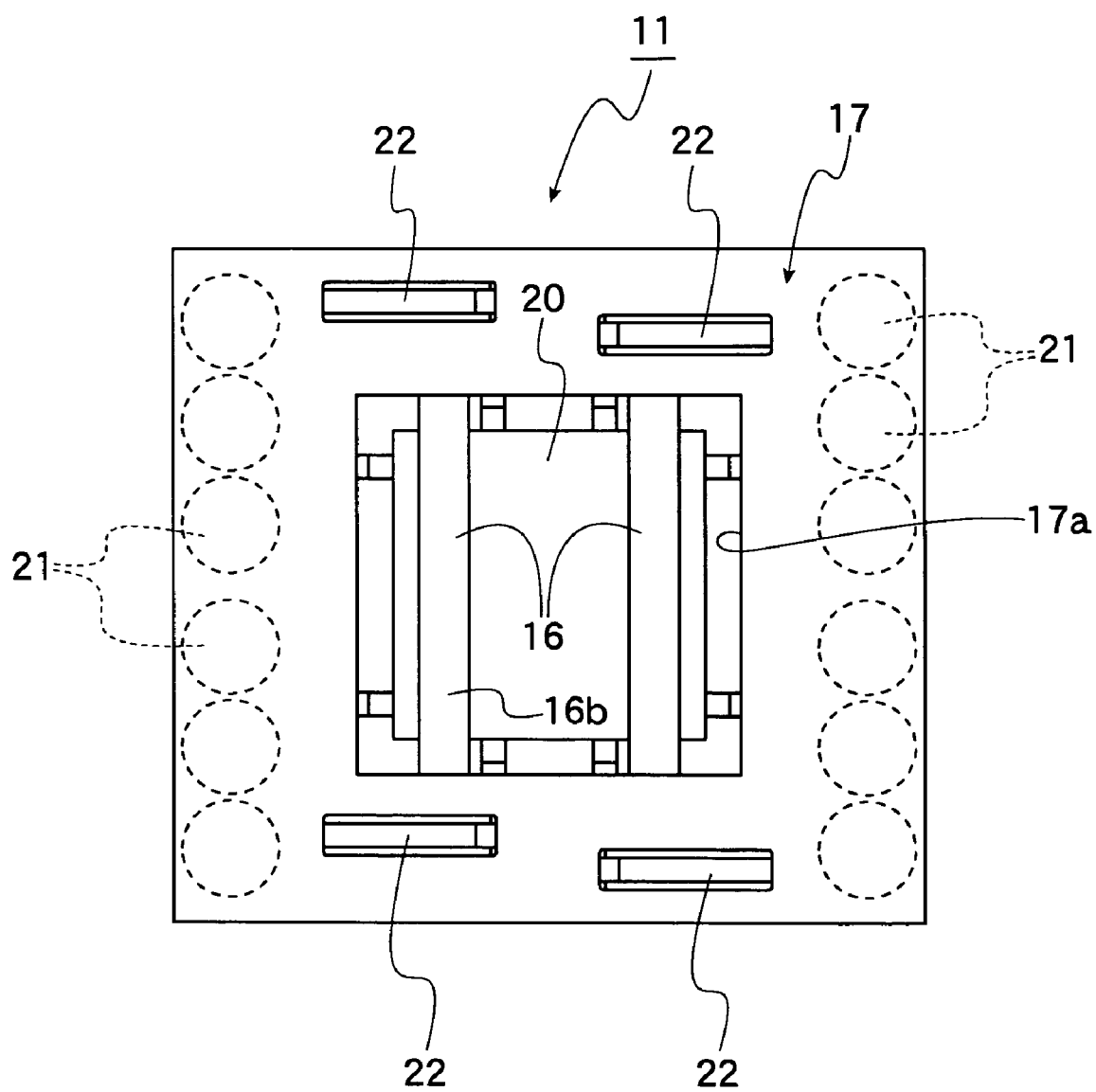
FIG. 2 is a plan view of the IC socket according to the first embodiment.
Figure 3:
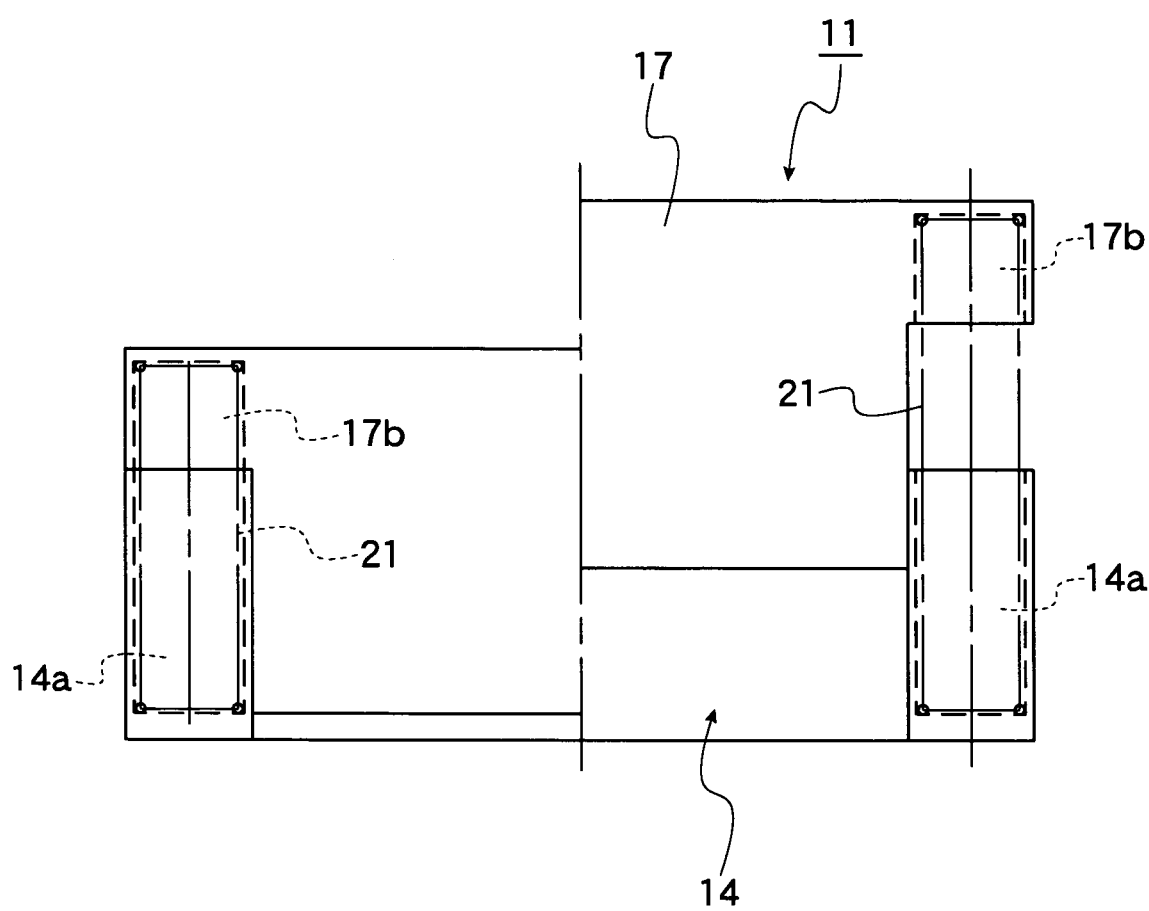
FIG. 3 is a front view of the IC socket according to the first embodiment when the left part from the centerline of an operating member is depressed.
Figure 4:
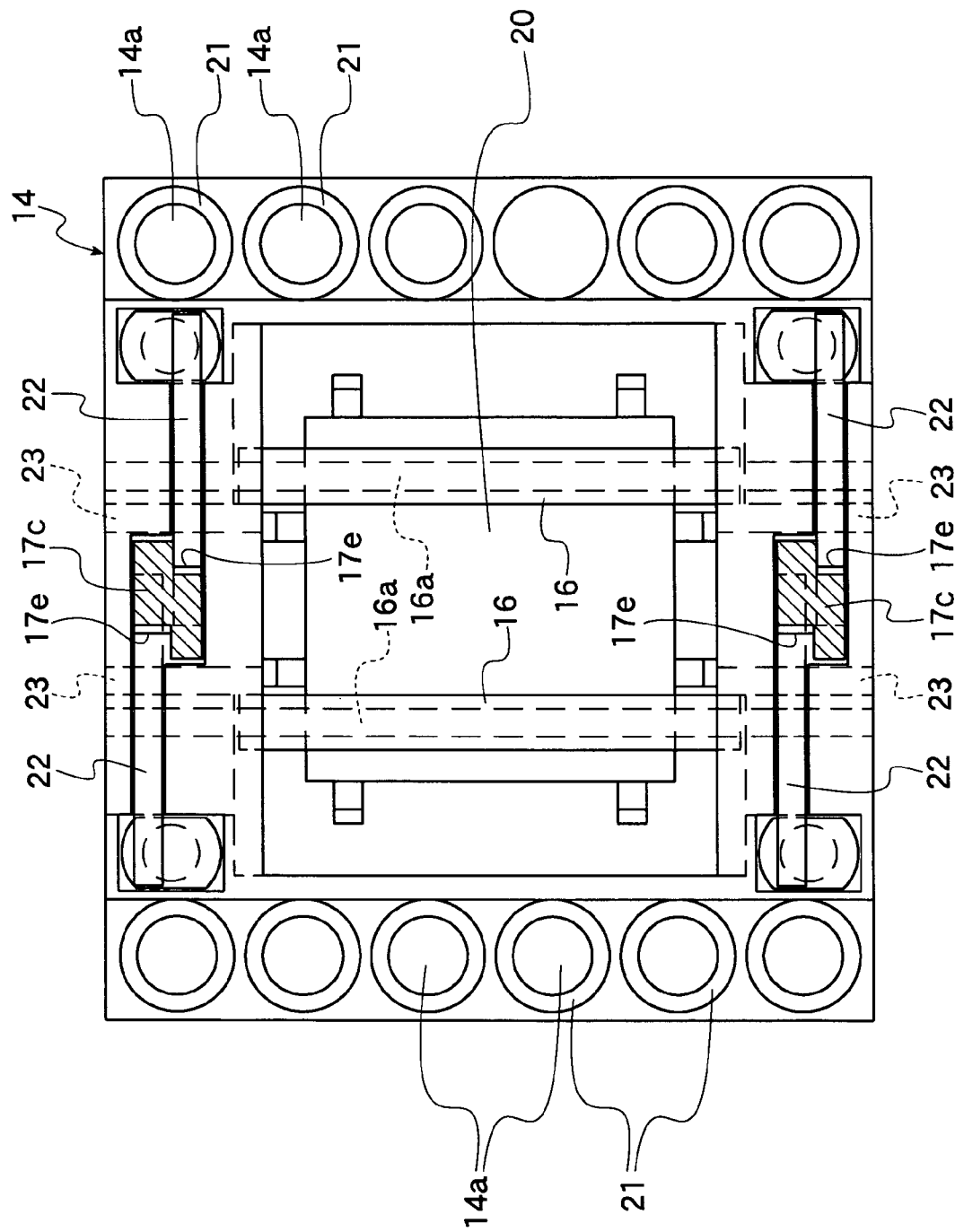
FIG. 4 is a plan view of the IC socket according to the first embodiment when the operating member is removed.
Figure 5:
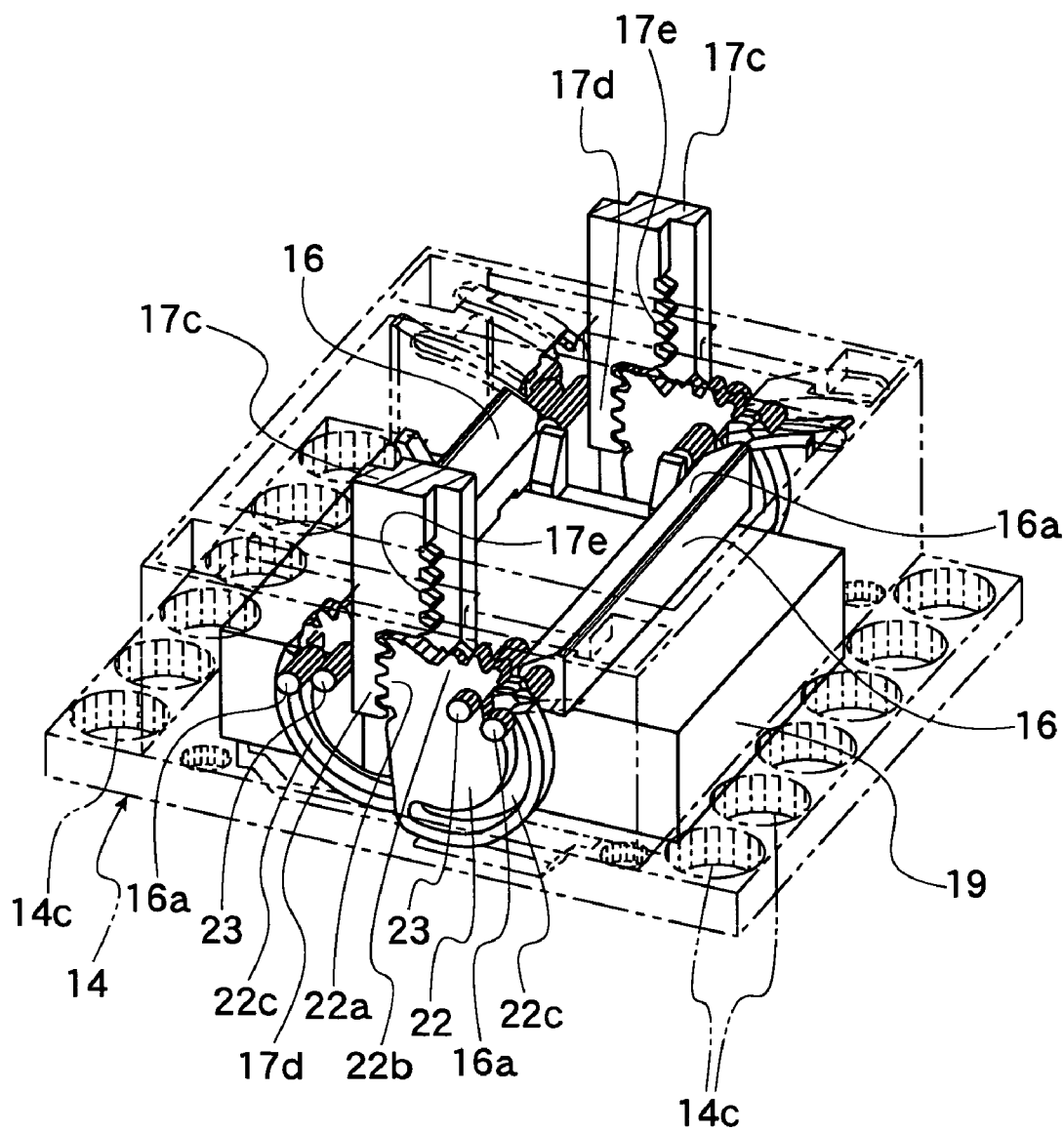

Referring to FIGS. 2 and 5, a pair of the pressing members 16 having a substantially rod-like shape are provided on the right and left side. The pressing members 16 are longer than the side of the square IC package 12. Driving pins or "driving portions" 16a extend through the pressing members 16 and protrude from both ends of the pressing members 16.

Figure 1:
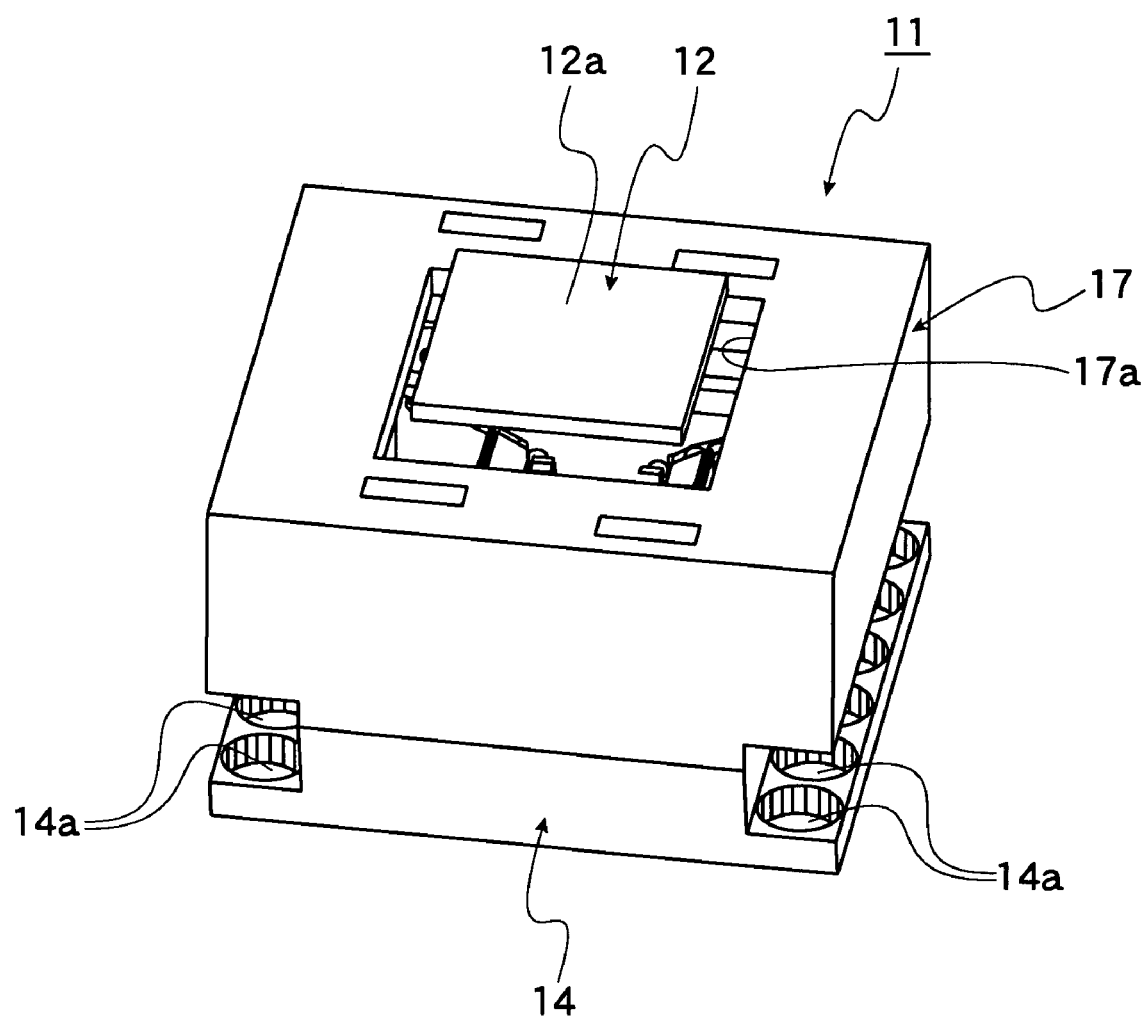
FIG. 1 is a perspective view of an IC socket according to a first embodiment of the present invention.

Referring to FIGS. 1 and 2, the operating member 17 is a square frame with a square opening 17a in the center when viewed from the top. The IC package 12 can be accommodated and taken out through the opening 17a. The operating member 17 is disposed to be vertically movable with respect to the socket body 14 and is urged upward by a plurality of springs 21. Lines of springs 21 disposed close to each other are aligned on opposing sides of the square operating member 17. These springs 21 are accommodated in column-shaped recessed portions 17b provided in the operating member 17 and recessed portions 14a provided in the socket body 14 such that the neighboring springs 21 do not interfere with each other.

A pair of racks 17c extends downward from the other opposing sides of the operating member 17, where the springs 21 are not provided. The pair of racks 17c constitutes the "driving mechanisms" and is integrally formed with the operating member 17. Alternatively, the racks 17c may be formed separately from the operating member 17 and may be attached thereto. Each rack 17c includes a first rack gear 17d on each bottom side of the rack 17c and a second rack gear 17e on each top side of the rack 17c. The first rack gear 17d and the second rack gear 17e on the left side are not illustrated in FIGS. 6 to 10.

A pair of cam 22 is disposed in the vicinity of both sides of each rack 17c. These cam 22 constitute the "driving mechanism" and are provided in the socket body 14 so as to rotate around rotation shafts 23 in accordance with the vertical movement of the operating member 17. A first follower gear 22a engageable with the first rack gear 17d and a second follower gear 22b engageable with the second rack gear 17e are provided on the periphery of each cam 22.

Figure 8:
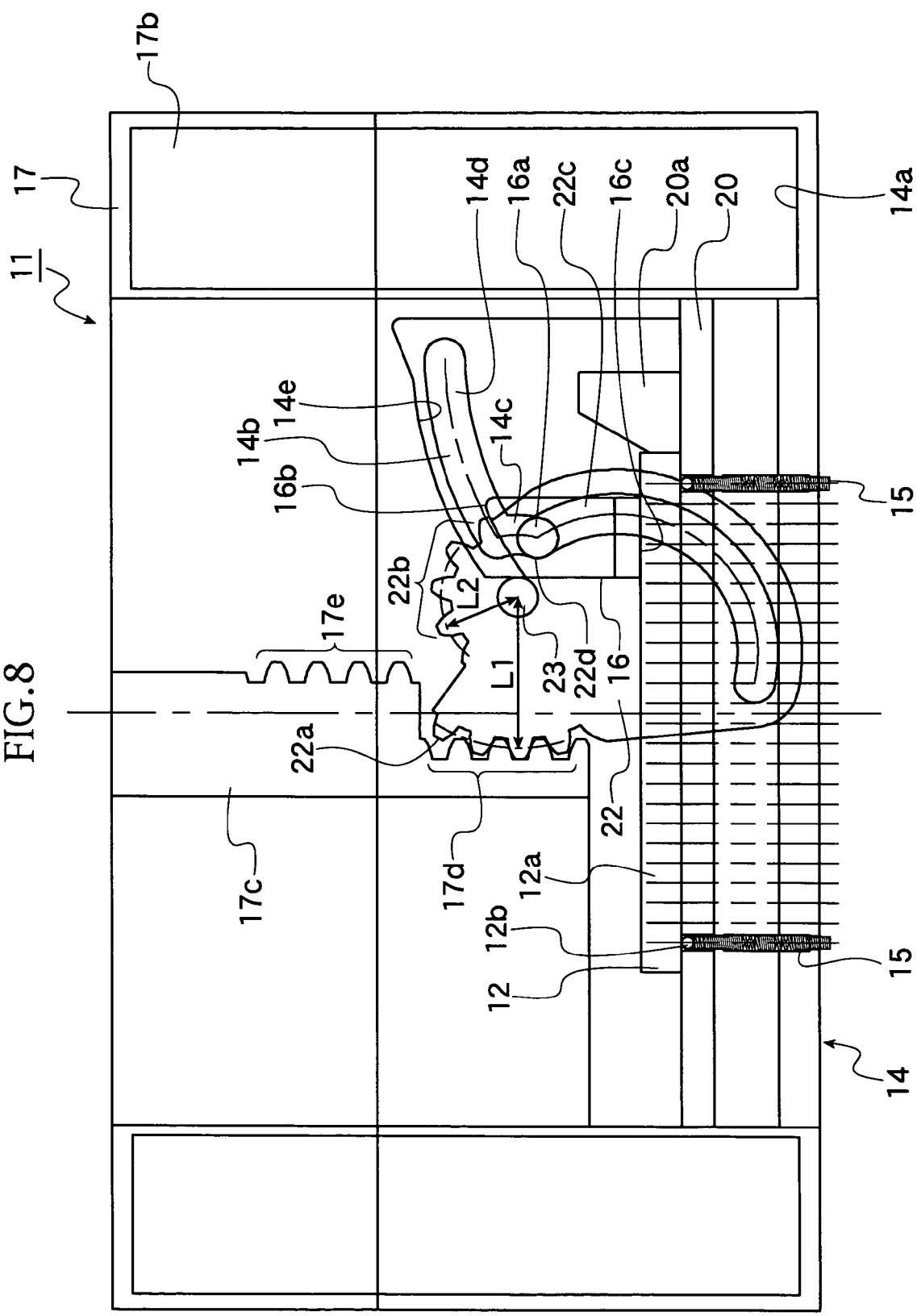
FIG. 8 is an explanatory view showing the operation of the IC socket according to the first embodiment when the operating member is at the highest position.

A distance L1 from the center of the rotation shaft 23, which is the rotational pivot, to a pitch circle at the first follower gear 22a is longer than a distance L2 from the center of the rotation shaft 23 to another pitch circle at the second follower gear 22b. When the operating member 17 is depressed, as shown in FIGS. 6 and 8, the first follower gear 22a is engaged with the first rack gear 17d. In other words, the distance from the center of the rotation shaft 23 to the pitch circle at the first follower gear 22a is different from that at the second follower gear 22b. In this embodiment, the distance from the center of the rotational shaft 23 to the pitch circle is changed on a step-by-step basis but it may be continuously changed.

A cam groove 22c is disposed at each cam 22 in an arcuate shape around the rotation shaft and is substantially extended from the vicinity of the shaft 23 to the direction departing from the rotation shaft 23. Driving pins 16a protruding from both ends of the pressing member 16 are disposed in the cam grooves 22c.

Guide grooves 14b as "guide portions" are provided at the socket body 14. The driving pins 16a are disposed in the guide grooves 14b and are guided thereby. Each of the guide grooves 14b includes a short depressed-side guide portion 14c and a retired-side guide portion 14d. The depressed-side guide portion 14c extends vertically on the side where the pressing member 16 will be depressed, whereas the retired-side guide portion 14d gradually curves upward from the top end of the depressed-side guide portion 14c toward the side where the pressing member 16 will be retired.

Sliding surfaces 14e for guiding top surfaces 16b of the pressing members 16 are disposed at the socket body 14, as shown in FIGS. 6 and 7. When the pressing member 16 is moved, the top surface 16b of the pressing member 16 slides over the sliding surface 14e and thus the pressing member 16 is moved in parallel shift or displacement while maintaining a predetermined posture.

The socket for electrical parts of the present invention operates as follows.

When taking out the IC package 12 from the IC socket 11, the operating member 17 in the state shown in FIG. 8 is depressed against the urging force of the springs 21.

Figure 9:
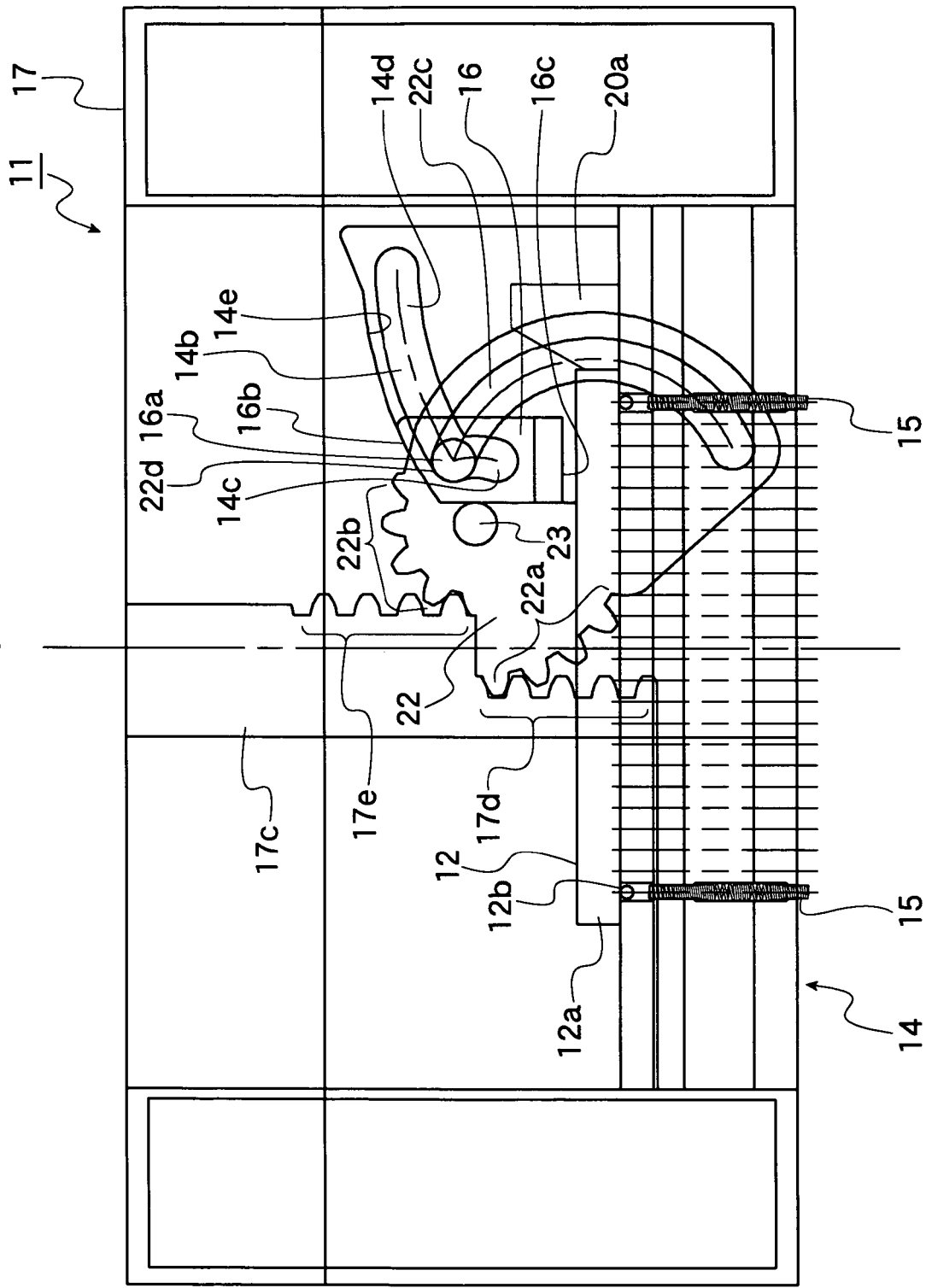
FIG. 9 is an explanatory view showing the operation of the IC socket according to the first embodiment while the operating member is descending.

As shown in FIG. 9, when the rack 17c of the operating member 17 is depressed, the cam 22 rotates around the rotation shaft 23 in a counterclockwise direction in FIG. 8, while the first rack gear 17d is engaged with the first follower gear 22a. Accordingly, the driving pin 16a of the pressing member 16 is shifted to the intersection of the cam groove 22c of the cam 22 and the guide groove 14b of the socket body 14 and the driving pin 16a is shifted to the retired-side guide portion 14d from the depressed-side guide portion 14c.

When the driving pin 16a is moved in the depressed-side guide portion 14c, the pressing member 16 is shifted substantially vertically from the pressing position for a predetermined distance. Accordingly, the pressing member 16 is detached from the top surface of the IC package 12 without scratching the top surface of the IC package 12.

Figure 10:
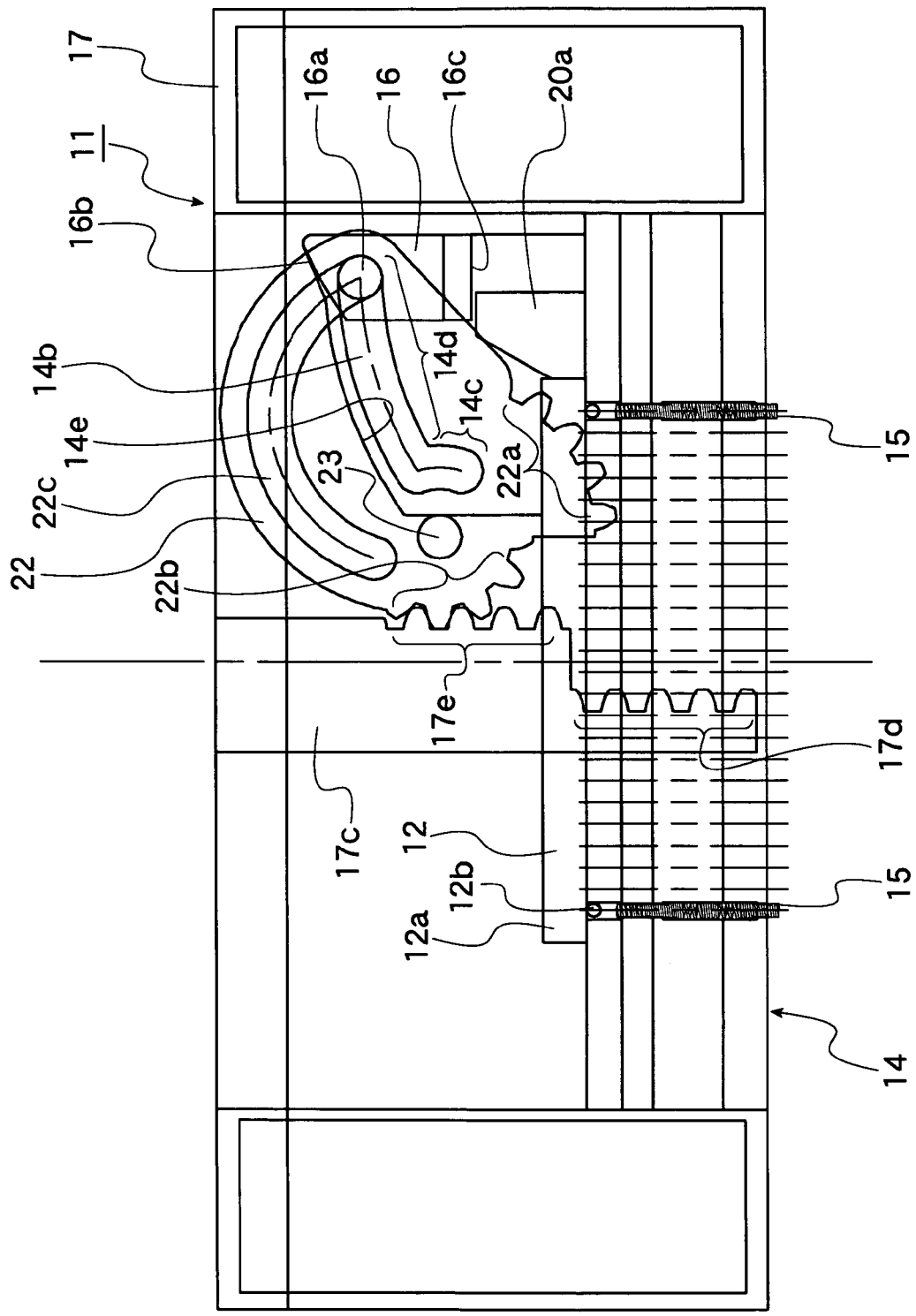
FIG. 10 is an explanatory view showing the operation of the IC socket according to the first embodiment when the operating member is at the lowest position.

As the rack 17c is further depressed, as shown in FIG. 10, the second rack gear 17e begins to engage with the second follower gear 22b of the cam 22. The distance L2 from the rotational pivot to the pitch circle at the second follower gear 22b is shorter than the distance L1 from the rotational pivot to the pitch circle at the first follower gear 22a so that the rotation speed of the cam 22 is faster when the second follower gear 22b is engaged with the second rack gear 17e than when the first follower gear 22a is engaged with the first rack gear 17d. That is, the pressing member 16 is moved faster in the retired-side guide portion 14c than in the depressed-side guide portion 14d, thereby reducing the time during which the pressing member 16 is shifted for a predetermined distance.

During the shifting of the pressing member 16, the top surface 16b of the pressing member 16 slides along the sliding surface 14e of the socket body 14. Therefore, the pressing member 16 is shifted in a parallel manner while maintaining a predetermined posture. When the operating member 17 is depressed to the lowest position, the pressing member 16 is shifted to the retired position, as shown in FIG. 10. In this state, the IC package 12 is taken out from the socket body 14 and another IC package 12 is placed on the floating plate 20 by guiding the IC package 12 with the guides 20a.

In the state shown in FIG. 10, when the depressing force to the operating member 17 is released, the operating member 17 moves upward by the urging force of the springs 21 and thus the pressing member 16 is moved back to the depressed position in the converse manner as when the pressing member 16 is moved to the retired position as described above.

Referring to FIG. 10, at the initial stage of the upward movement of the operating member 17, the second rack gear 17e of the rack 17c is engaged with the second follower gear 22b of the cam 22 and thus the cam 22 rotates in a clockwise direction. By this clockwise rotational movement of the cam 22, the driving pin 16a of the pressing member 16 is moved inside along the cam groove 22c of the cam 22 and then is shifted through the retired-side guide portion 14d of the guide groove 14b toward the depressed-side guide portion 14c.

Referring to FIG. 9, when the driving pin 16a reaches the top end of the depressed-side guide portion 14c, the first rack gear 17d of the rack 17c begins to engage with the first follower gear 22a of the cam 22. The distance L1 from the rotational pivot to the pitch circle at the first follower gear 22a is longer than the distance L2 from the rotational pivot to the pitch circle at the second follower gear 22b. Accordingly, the rotational speed of the cam 22 is slower when the first follower gear 22a is engaged with the first rack gear 17d than when the second follower gear 22b is engaged with the second rack gear 17e.

At this time, the driving pin 16a of the pressing member 16 is depressed by an end portion 22d of the cam groove 22c during the rotation of the cam 22. The driving pin 16a is moved downward from the top end of the depressed-side guide portion 14c of the guide groove 14b.

By the downward shift of the driving pin 16a in the depressed-side guide portion 14c, the pressing member 16 is depressed and a bottom surface 16c of the pressing member 16 presses the top surface of the IC package 12. The floating plate 20 is depressed against the urging force of the springs 21 so that the solder balls 12b of the IC package 12 come into contact with the top ends 15a of the contact pins 15 and thus are electrically connected to the contact pins 15. In this state, the performance test on the IC package 12 is carried out.

At this time, the driving pin 16a is shifted substantially perpendicularly in the downward direction in the depressed-side guide portion 14c of the guide groove 14b. Thus, the pressing member 16 will not scratch the top surface of the IC package 12 when being depressed.

The driving pin 16a of the pressing member 16 is depressed utilizing the urging force of the springs 21 via the operating member 17 and the cam 22. Application of the principle of leverage increases the depressing force to the driving pin 16a and the IC package 12.

In other words, as shown in FIG. 8, the distance L1 from the rotational pivot of the cam 22 to the pitch circle at the first follower gear 22a is larger than the distance L2 from the rotational pivot to the pitch circle at the second follower gear 22b and is larger than the distance from the rotational pivot of the cam 22 to the driving pin 16a. Accordingly, application of the principle of leverage increases the depressing force to the pressing member 16. That is, sufficient depressing force to the pressing member 16 can be ensured regardless of the strength of the springs 21.

According to the present invention, modification of the shape of the cam groove 22c improves the freedom of setting the shift path and the shift speed of the pressing member 16.

According to the present embodiment, since the depressed-side guide portion 14c is provided, the pressing member 16 moves downward perpendicularly and presses the IC package 12, whereas the pressing member 16 moves upward perpendicularly and is detached from the IC package 12. Thus, the pressing member 16 depresses the IC package 12 and is retired from the IC package 12 without scratching the top surface of the IC package 12.

After slightly ascending from the upper surface of the IC package 12, the pressing member 16 slides in the obliquely upward direction at a gently inclined angle so that the IC package 12 is retired from the area where the IC package 12 is put in and taken out. Thus, even a short stroke of the operating member 17 enables the IC package 12 to be pressed or the pressing member to be retired from the area where the IC package 12 is put in and taken out. Furthermore, the distance L2 from the rotational pivot to the pitch circle at the second follower gear 22b is shorter. Thus, even a short stroke of the operating member 17 enables the cam 22 to rotate at a large angle, thereby being able to move the pressing member 16 to the retired position.

Alternatively, the pressing member 16 may press a portion close to the center of the IC package 12. This suppresses the occurrence of warping in the IC package 12. With the recent trend toward low-profile, miniaturized IC packages, it is likely that warping may occur in the IC package 12. Therefore, by pressing the portion close to the center of the IC package 12, the occurrence of warping is advantageously suppressed.

Furthermore, since the length of the pressing member 16 is longer than that of the IC package 12, the IC package 12 is pressed across its length. This also suppresses the occurrence of warping in the IC package 12.

Since a cam mechanism and a gear mechanism are disposed between the operating member 17 and the pressing member 16, operating force from the operating member 17 is applied to the pressing member 16 via the cam mechanism and the gear mechanism. Thus, the operating member 17 and the pressing member 16 are operatively well associated.

The first rack gear 17d and the second rack gear 17e are disposed on both sides of the rack 17c, and the cam 22 is provided in the vicinity of either side of the rack 17c. Therefore, the two cams 22 share the single rack 17c, whereby the socket of the present invention has a simple structure with a minimized component count.

Furthermore, the springs 21 urge the operating member 17 upward. This urging force to the operating member 17, in turn, acts on the cam 22 so as to depress the driving pin 16a. Accordingly, additional springs are not needed in the transmission path of the driving force from the operating member 17 to the pressing member 16 so that the socket of the present invention has a simple construction.

Moreover, since a plurality of the springs 21 is aligned on the respective opposing sides of the square operating member 17 when viewed from the top, the springs 21 with an urging member having small elastic force can be disposed in the IC socket 11 at an appropriate position.

[Second Embodiment]

Figure 11:
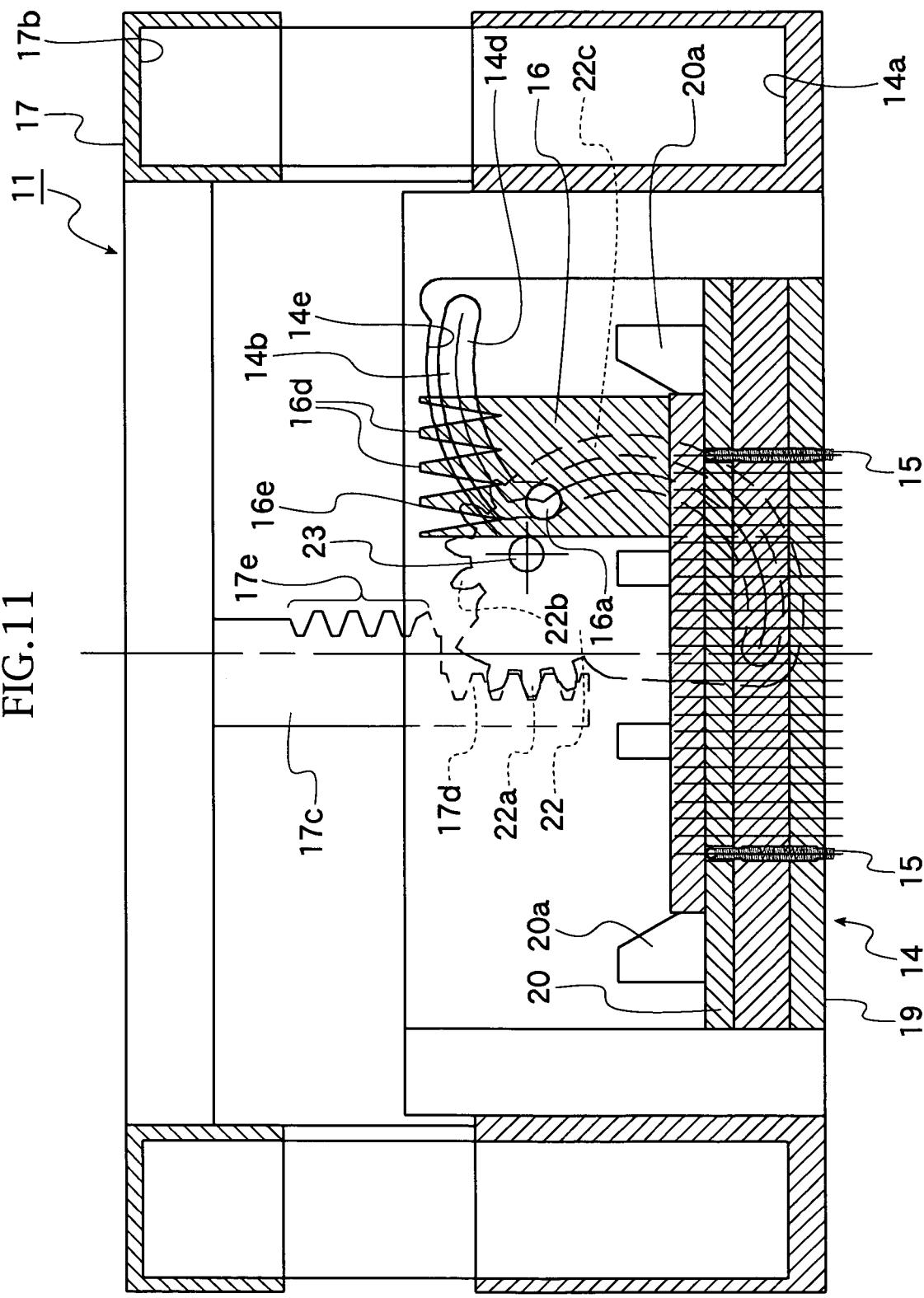
FIG. 11 is a cross-sectional view of an IC socket according to a second embodiment of the present invention and corresponds to FIG. 6.
Figure 12:
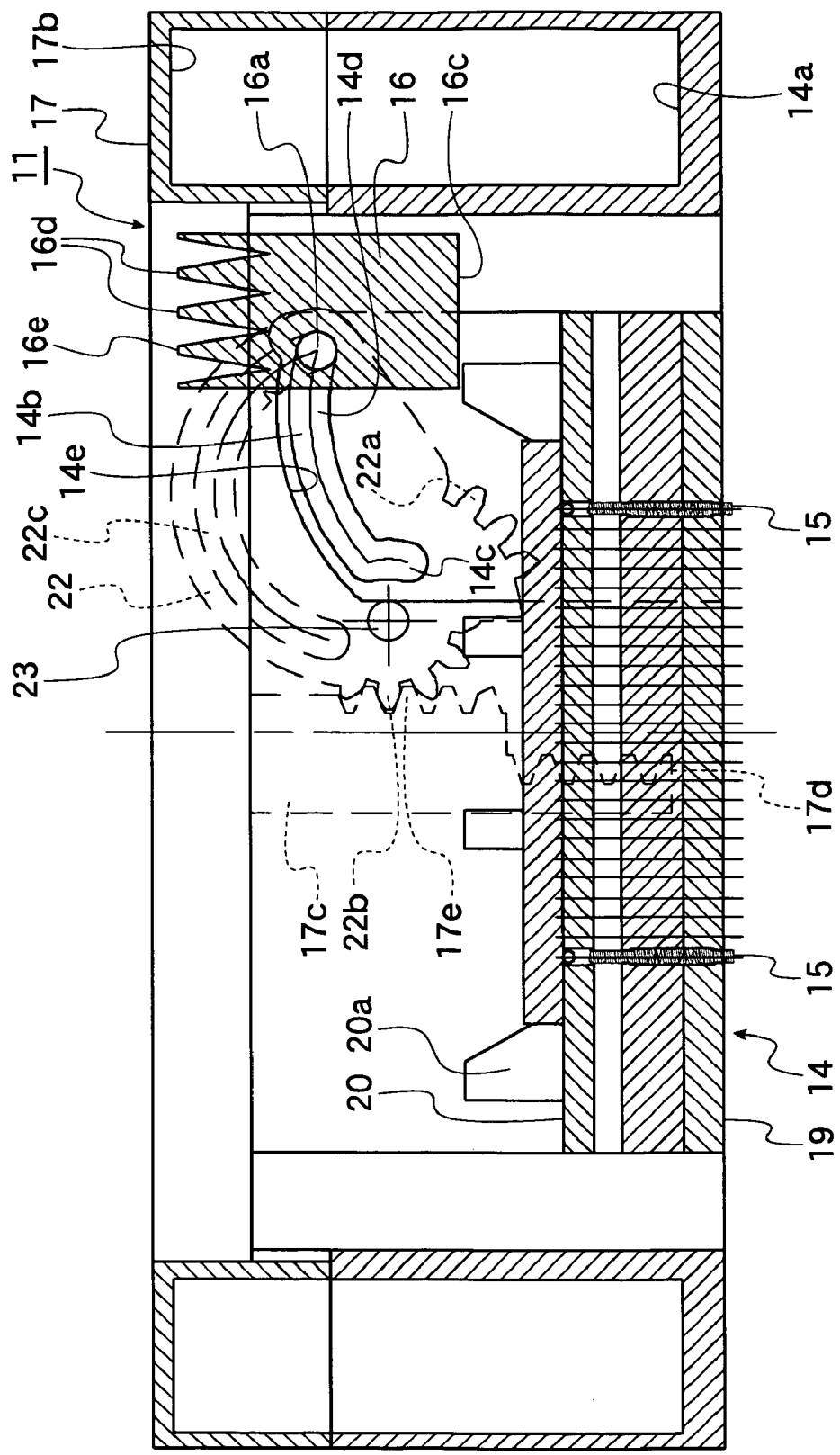
FIG. 12 is a cross-sectional view of the IC socket according to the second embodiment and corresponds to FIG. 7.

A second embodiment of the present invention is illustrated in FIGS. 11 and 12. According to the second embodiment, the pressing member 16 is composed of a material that easily dissipates heat such as aluminum and is provided with a heat sink 16e having a plurality of projections 16d on the top end thereof.

When the pressing member 16 depresses the IC package 12, heat from the IC package 12 is effectively dissipated through the heat sink 16e. Accordingly, the performance test is appropriately conducted on the IC package 12. Except for these features, the structure and the operation of the second embodiment is the same as those of the first embodiment and therefore the description thereof is not provided here.

[Third Embodiment]

Figure 13:
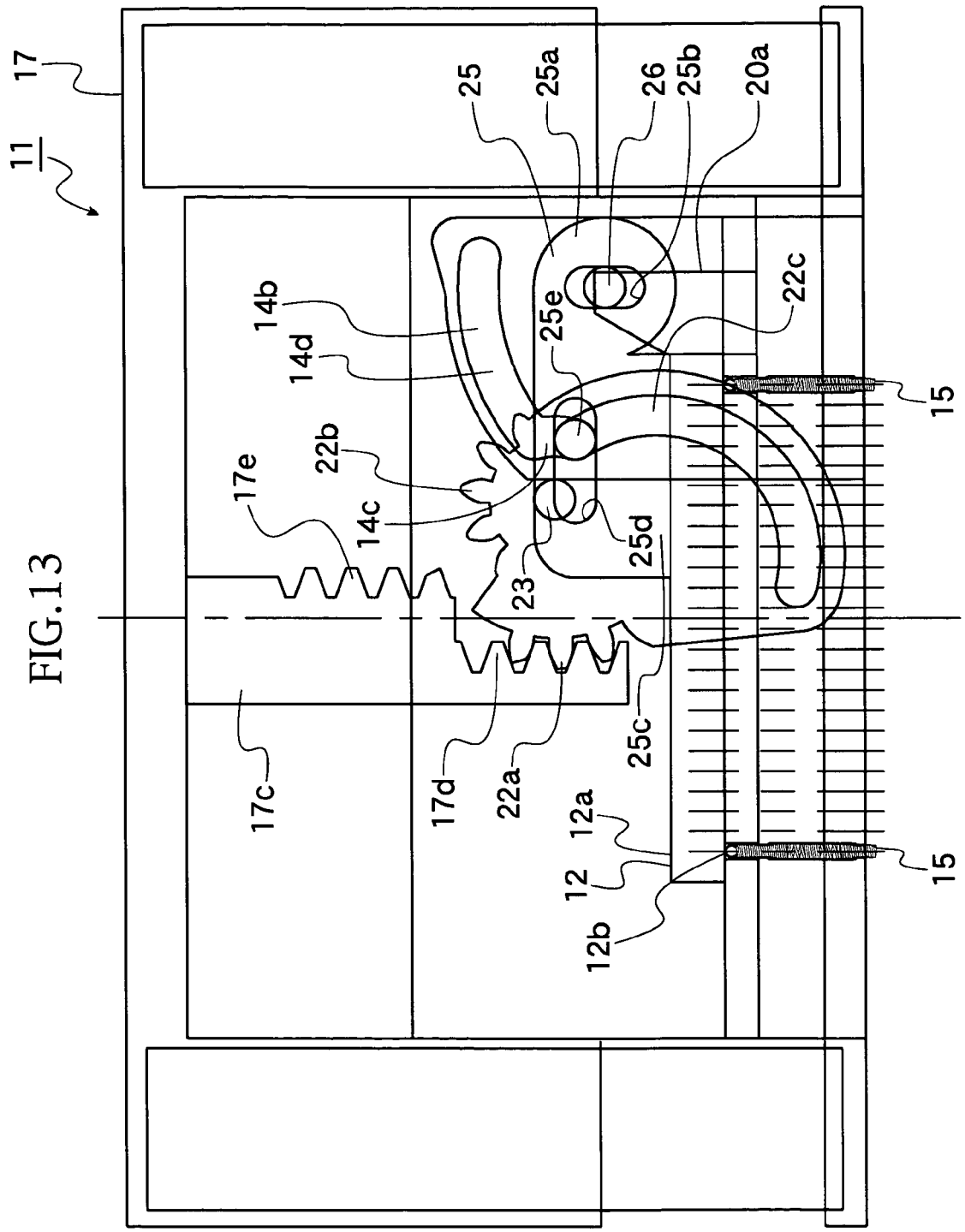
FIG. 13 is an explanatory view of an IC socket according to a third embodiment of the present invention and corresponds to FIG. 8.
Figure 14:
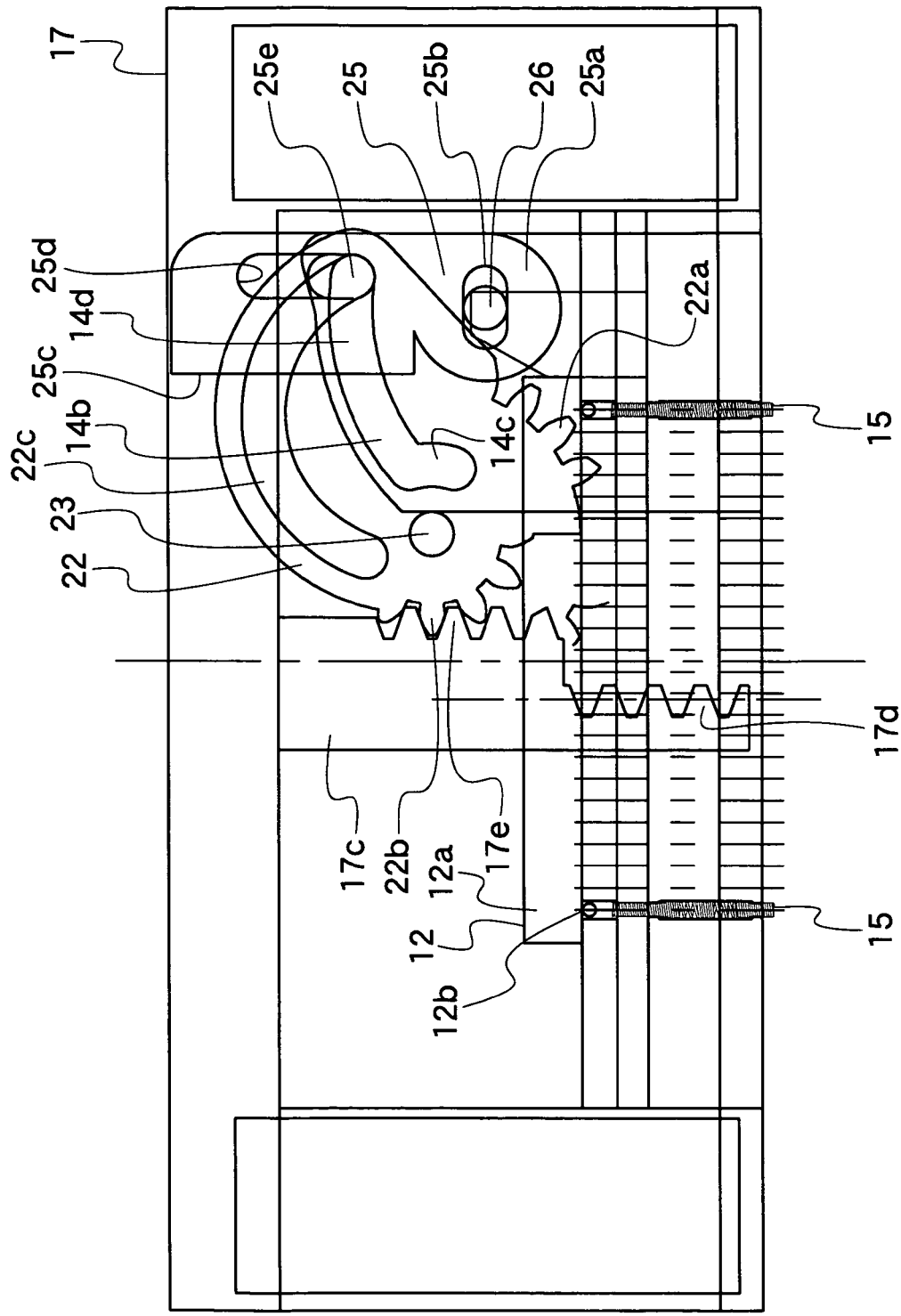
FIG. 14 is an explanatory view of the IC socket according to the third embodiment and corresponds to FIG. 10.

A third embodiment of the present invention is illustrated in FIGS. 13 and 14. According to the third embodiment, pressing members 25 are provided in place of the pressing members 16 of the first embodiment. That is, a pair of the pressing members 25 is provided laterally and presses substantially the entire top surface of the IC package 12. In FIGS. 13 and 14, only one of the pressing members 25 is shown.

Each of the pressing members 25 includes a base end portion 25a and a pressing portion 25c. The base end portion 25a has a base-end-side ellipsoidal opening in cross section. Shafts 26 are fixed to the socket body 14 and each of the shafts 26 is disposed in the base-end-side ellipsoidal opening 25b with a clearance therein. The pressing portion 25c has a pressing-side ellipsoidal opening in cross section, and a driving pin 25e is disposed in the pressing-side ellipsoidal opening 25d such that the driving pin 25e can move therein. The ends of the driving pins 25e are disposed in the cam grooves 22c of the cam 22 and the guide grooves 14b of the socket body 14.

The driving pin 25e is depressed by an end portion 22d of the cam groove 22c, and the driving pin 25e, in turn, depresses the pressing portion 25c of the pressing member 25, as shown in FIG. 13. A pair of pressing portions 25c with wide areas substantially depresses the entire surface of the IC package 12.

In this state, the operating member 17 is depressed against the urging force of the springs 21 and thus the cam 22 rotates in the counterclockwise direction as shown in FIG. 13. Accordingly, the driving pin 25e is shifted to the intersection of the cam groove 22c of the cam 22 and the guide groove 14b of the socket body 14. That is, the driving pin 25e is moved to the end of the retired-side guide portion 14d of the guide groove 14b, the end being far from the depressed-side guide portion 14c. Therefore, the pressing member 25 is moved so as to be substantially vertical to the IC package 12, the base end portion 25a being on the bottom and the pressing portion 25c being on the top. Accordingly, the pressing member 25 is moved to the retired position, as shown in FIG. 14, and the IC package 12 is taken out and another IC package 12 is placed.

According to such a socket of the third embodiment, since the pressing portions 25c of a pair of pressing members 25 substantially depress the entire surface of the IC package 12, the occurrence of warping in the IC package 12 is even more effectively suppressed. Similar to the first embodiment, with the application of the principle of leverage, the pressing member 25 can press the IC package 12 more effectively. Except for the aforementioned features, the structure and the operation of the third embodiment are the same as those of the first embodiment and thus the description thereof is omitted here.

Alternatively, the base-end-side ellipsoidal opening 25b disposed formed in the base end portion 25a may be a hole having a circular cross-section. Although in the above embodiments the IC socket 11 is exemplified as the socket for electrical parts, the socket of the present invention may be applied to other devices. Moreover, although in the above embodiments, the IC package 12 of a ball grid array (BGA) type is exemplified as the electrical part, other electrical parts such as IC packages of a land grid array (LGA) type or IC packages including terminals that protrude on the side of the socket body can be used.

What is claimed is:

1. A socket for electrical parts comprising:
a socket body for accommodating an electrical part;
a pressing member for pressing the electrical part accommodated in the socket body;
an operating member disposed to the socket body so as to move vertically; and
a driving mechanism for shifting the pressing member from a pressing position to a retired position in accordance with vertical movement of the operating member,
the driving mechanism comprises:
a rack disposed to the operating member in the vertical direction, the rack including a rack gear; and
a follower gear engageable with the rack gear, the follower gear having a first portion and a second portion, the distance from a rotational pivot to a pitch circle of the follower gear being longer at the first portion than at the second portion,
wherein when the operating member is depressed, the first portion of the follower gear is engaged with the rack gear.

2. The socket for electrical parts according to claim 1, wherein the driving mechanism comprises a cam, the cam including the follower gear so as to rotate around the rotational pivot, and the pressing member is movable between the pressing position and the retired position in accordance with rotational movement of the cam.

3. The socket for electrical parts according to claim 2, wherein the cam includes a cam groove, the pressing member includes a driving member, and the socket body includes a guide portion, the driving portion being disposed in the cam groove, the driving portion being guided by the guide portion,
wherein when the cam is rotated, the driving member is shifted to an intersection of the cam groove of the cam and the guide portion of the socket body so that the pressing member is moved from the pressing position to the retired position.

4. The socket for electrical parts according to claim 1, wherein the pressing member is disposed rotationally movable to the socket body.

5. The socket for electrical parts according to claim 1, wherein the rack includes a plurality of rack gears on both sides thereof.

6. A socket for electrical parts comprising:
a socket body for accommodating an electrical part,
a pressing member for pressing the electrical part accommodated in the socket body;
an operating member disposed to the socket body so as to move vertically; and
a driving mechanism for shifting the pressing member from a pressing position to a retired position in accordance with vertical movement of the operating member,
the driving mechanism comprising cam that rotates in accordance with the vertical movement of the operating member, the cam including a cam groove in which a driving portion of the pressing member is disposed, the socket body including a guide portion for guiding the driving portion of the pressing member, wherein when the cam is rotated, the driving member is shifted to the intersection of the cam groove of the cam and the guide portion of the socket body so that the pressing member is moved from the pressing position to the retired position.

7. The socket for electrical parts according to claim 6, wherein the guide portion includes a depressed-side guide portion for guiding the driving portion in a substantially vertical direction when the pressing member is in the vicinity of the pressing position.

8. The socket for electrical parts according to claim 6, wherein the cams and the guide portions are disposed on both sides of the square electrical part, the length of the pressing members is longer than that of the electrical part, and the pressing members press the electrical part across the entire length thereof.

9. The socket for electrical parts according to claim 6, wherein the pressing member has a rod-like shape, and the driving portion protrudes from both ends of the pressing member.

10. The socket for electrical parts according to claim 6, wherein the pressing member includes a base end portion and a pressing portion, the base end portion having a base-end-side ellipsoidal opening in cross section, and the socket body includes a shaft which is loosely inserted into the base-end-side ellipsoidal opening with a clearance therein, wherein the pressing portion includes a pressing-side ellipsoidal opening in cross section and the driving portion is movably disposed in the pressing-side ellipsoidal opening.

11. The socket for electrical parts according to claim 6, wherein the driving mechanism includes a rack disposed to the operating member in the vertical direction, the rack including a rack gear, and the cam includes a cam-side gear engageable with the rack gear.

12. The socket for electrical parts according to claim 11, wherein the cam are disposed on both sides of each rack.

13. The socket for electrical parts according to claim 1 or 6, wherein the pressing member includes a heat sink.

14. The socket for electrical parts according to claim 2 or 6, wherein urging member that urges the operating member upward is disposed, and urging force of the urging member acts on the cam so that the driving member is depressed.

15. The socket for electrical parts according to claim 14, wherein a plurality of the urging members are aligned on each opposing side of the operating member that has a square shape when viewed from the top.

16. A socket comprising:
a socket body for accommodating an electrical part;
a pressing member for pressing the electrical part accommodated in the socket body;
an operating member disposed to the socket body so as to move vertically; and
a driving mechanism for shifting the pressing member from a pressing position to a retired position in accordance with vertical movement of the operating member, the driving mechanism comprising:
a rack disposed to the operating member in the vertical direction, the rack including a rack gear, and
a rotationally movable cam, the cam having a follower gear engageable with the rack gear, wherein when the rack is moved vertically, the cam is rotated and the pressing member is moved from the pressing position where the pressing member presses the electrical part to the retired position.

17. An apparatus comprising:
a socket body for accommodating an electrical part;
a pressing member for pressing the electrical part accommodated in the socket body;
a rack movable in a vertical direction and including a rack gear; and
a rotationally movable cam, the cam having a follower gear engageable with the rack gear, wherein, when the rack is moved vertically, the cam is rotated and the pressing member is thereby moved from a pressing position where the pressing member presses the electrical part to a retired position.

* * * * *